:::: {.columns}
::: {.column}

(12) United States Patent
Baker et al.

(10) Patent No.: US 7,327,133 B2
(45) Date of Patent: Feb. 5, 2008

(54) CURRENT MEASURING DEVICE USING HALL SENSORS

(75) Inventors: Robert Bruce Baker, Cleveland, GA (US); David Lauren Wheaton, Sherwood, OR (US)

(73) Assignee: Universal Enterprises, Inc., Beaverton, OR (US)

( * ) Notice: Subject to any disclaimer, the term of this patent is extended or adjusted under 35 U.S.C. 154(b) by 84 days.

(21) Appl. No.: 11/429,099

(22) Filed: May 4, 2006

(65) Prior Publication Data
US 2007/0063689 A1    Mar. 22, 2007

Related U.S. Application Data

(60) Provisional application No. 60/719,472, filed on Sep. 21, 2005.

(51) Int. Cl.
*G01R 31/07* (2006.01)
(52) U.S. Cl. .............................. 324/117 H; 324/117 R; 324/127
(58) Field of Classification Search .................. None
See application file for complete search history.

(56) References Cited

U.S. PATENT DOCUMENTS

| | | | | |
|---|---|---|---|---|
| 1,862,613 | A | * | 6/1932 | Tomoda ........................ 336/66 |
| 2,143,555 | A | | 1/1939 | Hibberd |
| 2,266,624 | A | | 12/1941 | Hall |
| 2,375,591 | A | | 5/1945 | Schweltzer, Jr. |
| 3,213,365 | A | | 10/1965 | Wilson |
| 3,213,366 | A | | 10/1965 | Eadie, Jr. |
| 3,340,472 | A | | 9/1967 | Schweitzer, Jr. |
| 3,453,544 | A | | 7/1969 | Schweitzer, Jr. |

(Continued)

OTHER PUBLICATIONS

Asahi-Kasei CO.; HW-108A, InSb Hall Element (download of PDF file from www.asahi-kasei.co.jp/ake/en/ms/pdf/hw108a.pdf);located in early Aug. 2005; 2 pages.

(Continued)

*Primary Examiner*—Paresh Patel
(74) *Attorney, Agent, or Firm*—Chernoff, Vilhauer, McClung & Stenzel, LLP (57) ABSTRACT

The present invention provides a current measuring device including a probe body having an elongated portion extending outward to a hook-shaped end wherein the hook-shaped end useful for isolating a conductor under test, a U-shaped magnetic core positioned upside down within the probe body and forming the hook-shaped end of the probe body wherein the U-shaped magnetic core has an interior surface extending between a first end and a second end and defines a current sensing zone therebetween, a first Hall sensor disposed upon the first end of the interior surface of the U-shaped magnetic core, and a second Hall sensor disposed upon the second end of the interior surface of the U-shaped magnetic core wherein the Hall sensors are capable of detecting a magnetic flux generated by an electric current passing through the conductor under test positioned within the current sensing zone. The device may further include amplifier circuitry electrically interconnected with the Hall sensors for amplifying electrical signals therefrom, an output board interconnected with the amplifier circuitry for receiving an amplified output signal from the amplifier circuitry and for providing power to the amplifier circuitry, and a digital multimeter extending rearward from the probe body opposite the hook-shaped end and electrically coupled to the output board.

21 Claims, 5 Drawing Sheets

U.S. PATENT DOCUMENTS

| | | | |
|---|---|---|---|
| 3,706,032 A | 12/1972 | Vikstrom | |
| 4,004,221 A | 1/1977 | Wilson | |
| 4,071,824 A | 1/1978 | Kernander et al. | |
| 4,558,276 A * | 12/1985 | Comeau et al. | 324/117 H |
| 4,559,496 A | 12/1985 | Harnder, Jr. et al. | |
| 4,754,218 A | 6/1988 | Wagner et al. | |
| 5,057,769 A | 10/1991 | Edwards | |
| 5,124,642 A * | 6/1992 | Marx | 324/127 |
| 5,130,642 A | 7/1992 | Hoffman et al. | |
| 5,349,289 A | 9/1994 | Shirai | |
| 5,610,512 A | 3/1997 | Selcuk | |
| 5,615,075 A | 3/1997 | Kim | |
| 5,923,161 A | 7/1999 | Frankovitch, Jr. et al. | |
| 6,043,640 A | 3/2000 | Lauby et al. | |
| 6,252,389 B1 | 6/2001 | Baba et al. | |
| 6,456,060 B1 | 9/2002 | Wiesemann | |
| 6,541,955 B2 | 4/2003 | Landre | |
| 6,586,923 B2 | 7/2003 | Seike | |
| 6,781,359 B2 | 8/2004 | Stauth et al. | |

OTHER PUBLICATIONS

MICRONAS, Sensors System Solutions, Industial application—current measurement (web page—www.micronas.com/products/overview/sensors/details/sensor6.php); Aug. 8, 2005; 1 page.

MICRONAS, Sensors Overview and Systems Solutions, Hall Effect Sensor (web page—www.micronas.com/products/overview/sensors/index.php); Aug. 8, 2005; 12 pages.

WIKIPEDIA, Hall effect (web page—http://en.wikipedia.org/wiki/Hall_effect); Aug. 8, 2005; 4 pages.

* cited by examiner

$I_C$: CURRENT OF CONTROL
$V_H$: HALL VOLTAGE
B: MAGNETIC FLEX DENSITY

FIG.5a

①(+) − ③(−): $I_C$ (INPUT)
②(−) − ④(+): $V_H$ (OUTPUT)

CURRENT MEASURING DEVICE USING HALL SENSORS

CROSS-REFERENCE TO RELATED APPLICATIONS

This application claims the benefit of U.S. provisional application Ser. No. 60/719,472, filed Sep. 21, 2005, having the same title and inventorship as the present application. The specification of the above provisional application is incorporated in its entirety herein by reference.

BACKGROUND OF THE INVENTION

The technical field of invention relates to a current measuring device for measuring an electric current running through a conductor. More particularly, the present invention pertains to a hand-held hook-shaped electronic current measuring device for measuring an electric current running through a conductor by detecting the magnetic flux generated by the electric current.

Non-contact, non-interrupt current measuring instruments are used in numerous applications where a conductor to be tested is live and cannot be electrically disrupted. Such applications are common, for example, in factory or office power distribution systems. Reliable and efficient means to measure current passing through an electrical conductor (or wire) without disconnecting the conductor or without direct electrical contact with the conductor have been attempted with varying degrees of success by different types of current measuring devices.

Perhaps the most common hand-held current measuring devices are of the clamp-on or hook-on type. Some brands of clamp-on current measuring devices are referred to as hook jaw type current measuring devices. All of these devices comprise a substantially circular clamping ring wherewithin a conductor may be positioned by opening a section of the clamping ring, positioning the clamping ring around the conductor, and finally closing the clamping ring whereafter a current flowing through the conductor, typically an alternating current, may be measured. Such devices are available in a wide variety of sizes and with various sensitivities. However, all such clamp-on type current measuring devices share an inherent disadvantage of requiring a mechanism for opening and closing a clamping ring (or core) making their overall structure more complicated and more expensive to manufacture than devices without such mechanism. Further, users of such conventional clamp-on type current measuring devices have indicated that the clamping ring is too large to fit around conductors when working in smaller spaces such as junction boxes, distribution panels, or similar electrical system enclosures. The conventional clamp-on type device requires the user to have enough space to close the clamping ring around the conductor in order to make a current measurement.

U.S. Pat. No. 6,456,060 by Wiesemann and U.S. Pat. No. 5,349,289 by Shirai are each directed to hand-held clamp-on type current meters. Both include a side lever mechanism for opening one side of a clamping ring which, when depressed, allows for insertion of a conductor into an area enclosed by the clamping ring. Other clamp-on type devices, such as the clamp-on device disclosed in U.S. Pat. No. 5,610,512 by Selcuk, include a side lever mechanism that operates to open two halves of a clamping ring. Yet another clamp-on type device, disclosed in U.S. Pat. No. 6,541,955 by Landre, uses a pliers type mechanism for opening two halves of a clamping ring. Each of these exemplary clamp-on type current measuring devices include a clamping ring that is opened for insertion of a conductor to be tested and closed to allow for a current measurement.

An alternative to the clamp-on type current measuring device is a hand-held open fork type device that uses a C-shaped or horseshoe-shaped core wherewithin a conductor may be positioned for measuring an electric current passing through the conductor. U.S. Pat. No. 6,586,923 by Seike and U.S. Pat. No. 6,043,640 by Lauby et al. are each directed to hand-held open fork type current meters. Such open fork type devices require the user to either extend the device forward to position a conductor under test into the interior area within the C-shaped core or to bring the conductor rearward and into the interior area in order make a current measurement. Open fork type devices may be less bulky and easier to use in certain applications than the conventional clamp-on devices. However, open fork type devices still require undesirable manipulations in many routinely encountered situations.

For example, unlike the use of clamp-on type devices whereby a conductor under test may be isolated by closing the jaws or portions of the core (ring) around the conductor, thus affirmatively isolating the conductor, isolating a conductor with an open fork type device may require that the user reach with a free hand into the space occupied by the conductor in an effort to pull the conductor into the C-shaped core area so that a current measurement may be attempted. In typical applications, such manipulations may need to be repeated frequently, especially where several conductors are aggregated or bundled together in an electrical system access panel, junction box, distribution panel, or similar enclosure commonly used in wiring systems.

What is needed is a current measuring device that provides a user with improved convenience and utility for various applications, especially for applications where the user may be required to work within tight spaces or spaces having several conductors bundled closely together. What is needed, therefore, is a different style of current measuring device.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

For a more complete understanding of the present invention, the drawings herein illustrate examples of the invention. The drawings, however, do not limit the scope of the invention. Similar references in the drawings indicate similar elements.

DETAILED DESCRIPTION OF PREFERRED EMBODIMENTS

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and systems have not been described in detail.

Various operations will be described as multiple discrete steps performed in turn in a manner that is helpful for understanding the present invention. However, the order of description should not be construed as to imply that these operations are necessarily performed in the order they are presented, nor even order dependent.

Figures 1, 2A, 2B:
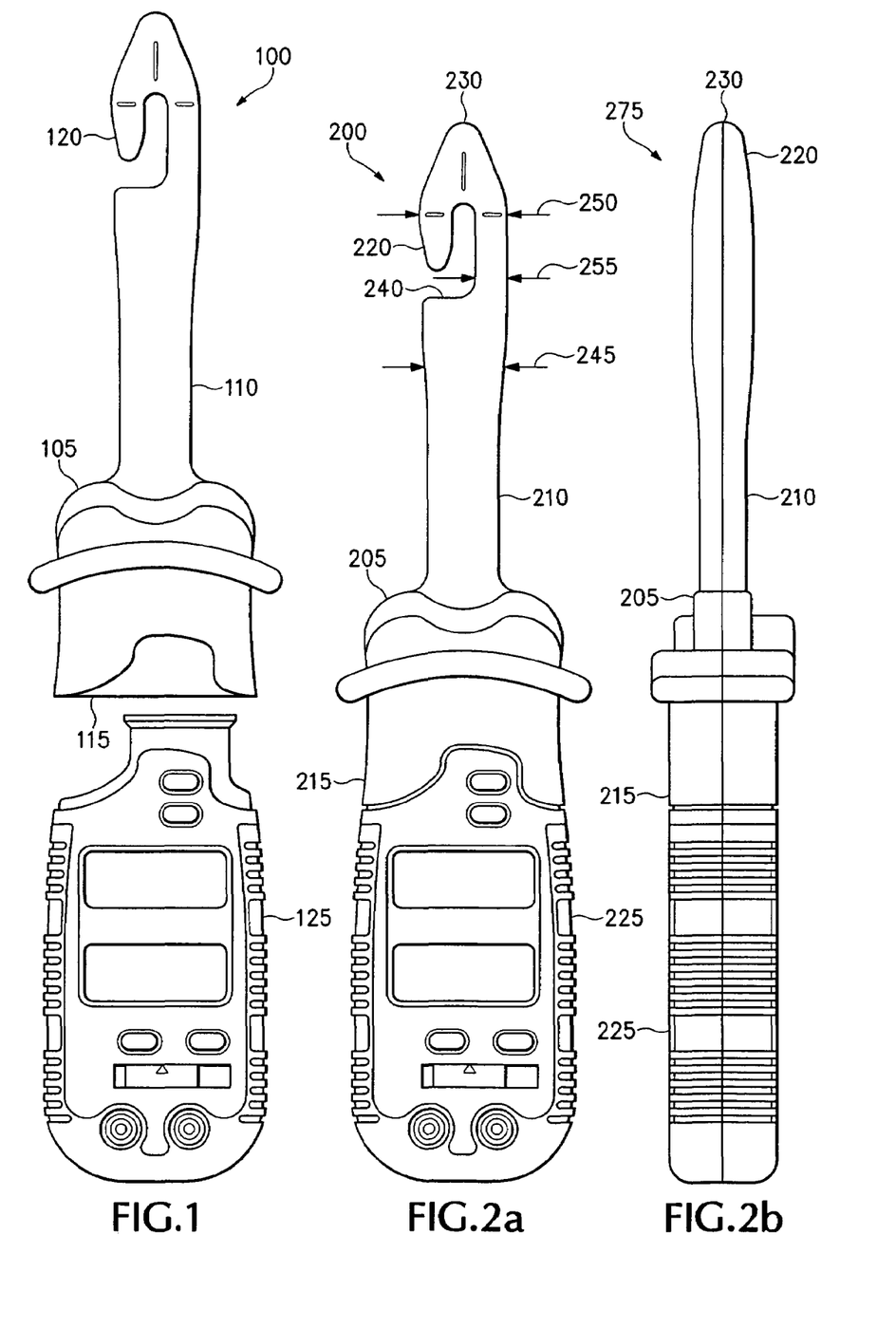
FIG. 1 illustrates a current measuring device according to one embodiment of the invention.
FIGS. 2a and 2b illustrate front and side views, respectively, of a current measuring device according to one embodiment of the invention.

Turning now to the several drawings, FIG. 1 illustrates a current measuring device 100 according to one embodiment of the invention. As shown, the current measuring device 100 comprises a probe body 105 having an elongated portion 110 extending from a rearward end 115 outward to a hook-shaped end 120. The rearward end 115 of the probe body 105 may receive a main body 125 extending rearward from the probe body 105 opposite the hook-shaped end 120.

The main body 125, as shown in FIG. 1, comprises a digital multimeter unit coupled to and extending rearward from the rearward end 115 of the probe body 105. The digital multimeter comprises electrical circuitry for at least one and preferably all of providing power to the probe body, receiving output signals from the probe body, converting the output signals from analog signals to digital signals as necessary, conditioning the analog or digital output signals in response to mode settings selected by a user, and displaying information representative of a current measurement on a display associated with the digital multimeter. However, the main body 125 may comprise any of a wide variety of multimeter units or current meter units capable of providing power to the probe body 105 and receiving an output signal from the probe body 105. Hand-held multimeter units typically include various control buttons for selecting testing modes, powering the unit, enabling one or more display, and so forth.

A U-shaped magnetic core (not shown) is positioned upside down within the probe body 105 forming the hook-shaped end 120 of the probe body 105. The hook-shaped end 120 of the probe body 105 provides the user with a convenient tool for isolating a conductor to be tested. For example, the user may extend the current measuring device 100 outward to reach into an electrical access panel having multiple conductors, manipulate the conductors with slight movements of the hook-shaped end 120 of the probe body 105 so as to separate a conductor to be tested, and then hook or capture the selected conductor by pulling the current measuring device 100 inward (rearward) toward the user. Once the conductor is captured within the area formed by the upside down U-shaped magnetic core, which forms the hook-shaped end 120 (and comprises a current sensing zone), a current measurement (for alternating current and/or direct current) may be taken.

FIGS. 2a and 2b illustrate front 200 and side 275 views, respectively, of a current measuring device according to one embodiment of the invention. In each view, a probe body 205 having an elongated portion (or neck) 210 extending outward to a hook-shaped end 220 is shown with a rearward end 215 of the probe body 205 receivably coupled with a main body 225. In the front view 200, the elongated portion 210 and hook-shaped end 220 together resemble the profile shape of a crochet hook wherein the hook-shaped end 220 substantially resembles a crochet hook end. Likewise, in the side view 275, the elongated portion 210 and hook-shaped end 220 together resemble the profile shape of a crochet hook rotated one quarter turn (or 90 degrees) about an axis running lengthwise from the rearward end 215 extending outward to a probe body tip 230. In other words, a common crochet hook used for knitting, if enlarged or scaled up in overall size, has a profile shape and appearance substantially similar to that of the front view 200 portion comprising the elongated portion 210 and hook-shaped end 220. Rotating the common crochet hook one quarter turn about its lengthwise axis provides a profile shape and appearance substantially similar to that of the side view 275 portion comprising the elongated portion 210 and hook-shaped end 220.

As shown, the hook-shaped end 220 includes an opening 235 on one side of the hook-shaped end 220 through which a conductor to be tested may be captured. The opening 235 leads to an area (or current sensing zone) formed by the upside down U-shaped magnetic core forming the hook-shaped end 220 wherewithin the conductor under test is positioned for current measurement. The hook-shaped end 220 may further include a ledge 240 substantially perpendicular to the elongated portion 210 and positioned inward (rearward) from the current sensing zone and adjacent to the opening 235. The ledge 240, in one embodiment, may be used for pushing a conductor to be tested in an outward direction substantially parallel to the elongated portion 210 of the probe body 205 and toward the probe body tip 230.

As will be appreciated, the elongated portion 210 and hook-shaped end 220 of the probe body 205 may comprise various hook profiles. For example, as illustrated in FIG. 2a, the neck width 245 of the elongated portion 210 is preferably the same as the largest width 250 of the hook-shaped end 220. This profile shape is characterized as a crochet hook profile shape. By contrast, the neck width 245 may be narrower. For instance, in an embodiment not shown, the neck width 245 may be as narrow as one side 255 of the upside down U-shaped portion of the hook-shaped end 220. That is, the elongated portion of the probe body 205 may share the same width dimension as one side 255 of the hook-shaped end 220. Such a profile shape is characterized as a shepherd's hook or candy cane profile shape.

Still referring to FIGS. 2a and 2b, the profile shape of the hook-shaped end 220 may incorporate various profiles for the probe body tip 230. The probe body tip 230 may be tapered to improve the ease with which the probe body 205 may be used to manipulate conductors within tight spaces. Additionally or alternatively, the probe body tip 230 may be rounded, substantially following the curvature of the upside down U-shaped magnetic core within the hook-shaped end 220 of the probe body 205.

Figures 3, 4:
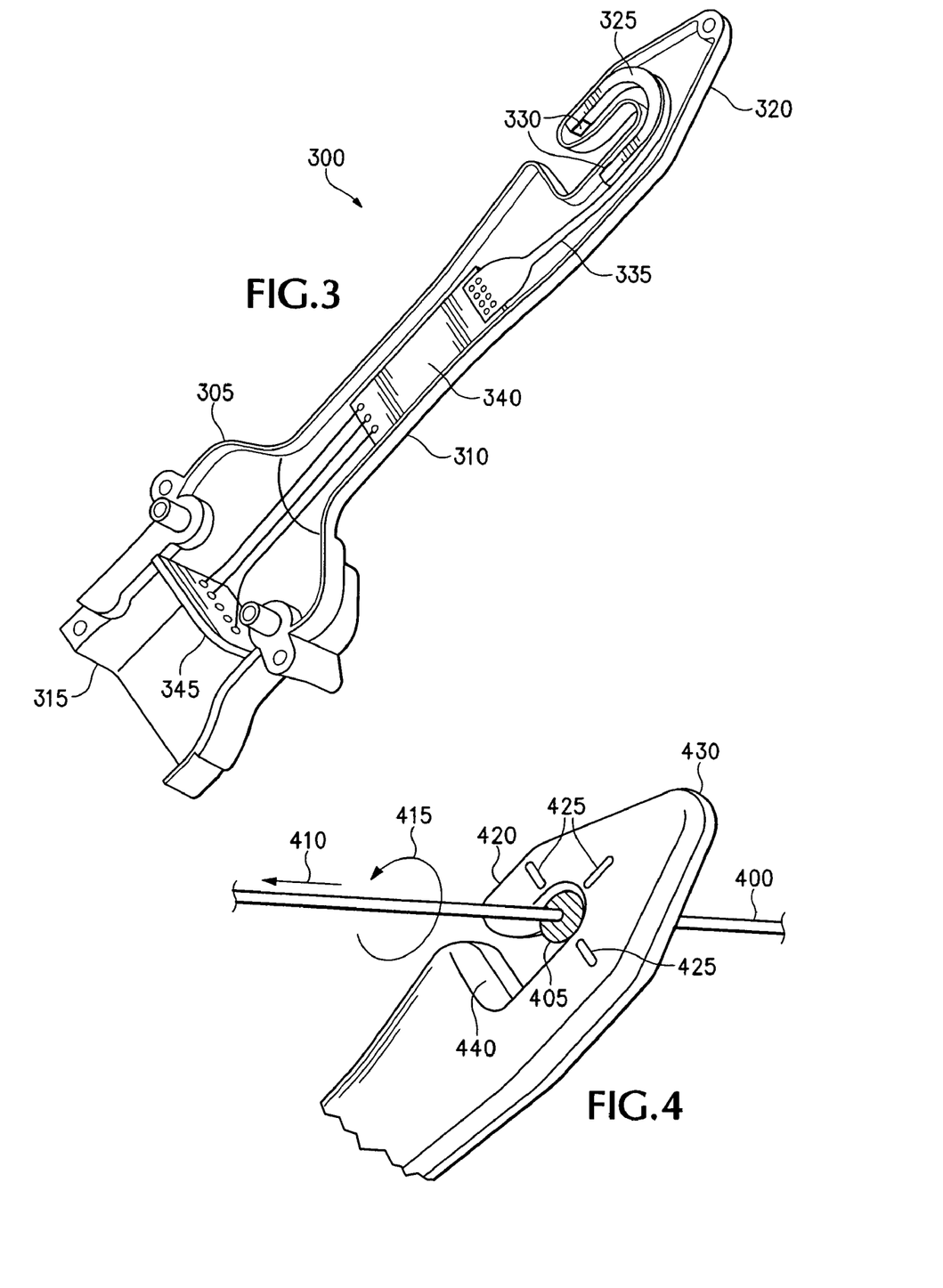
FIG. 3 illustrates a transparent perspective view of a current measuring device according to one embodiment of the invention.
FIG. 4 illustrates a perspective view of a hook-shaped end of a current measuring device according to one embodiment of the invention.

Next, FIG. 3 illustrates a transparent perspective view of a current measuring device 300 according to one embodiment of the invention. As shown, the current measuring device 300 comprises a probe body 305 having an elongated portion 310 extending from a rearward end 315 outward to a hook-shaped end 320. A U-shaped magnetic core 325 is positioned upside down within the probe body 305 forming the hook-shaped end 320 of the probe body 305. The U-shaped magnetic core 325, as shown, has an interior surface extending between the two ends of the U-shape. At each of the two ends, a Hall sensor element 330 is affixed to the interior surface of the U-shaped magnetic core 325.

The U-shaped magnetic core 325 preferably comprises a non-grain oriented silicon steel material such as suitably chosen and readily available core materials manufactured by JFE Steel Corporation in Japan. However, other Silicon alloy Ferromagnetic core materials may be used. Positioning the U-shaped magnetic core 325 in the upside down orientation shown in FIG. 3 reduces the magnetic interference received from neighboring live conductors when measuring a current running through a conductor under test positioned within the current sensing zone. Further, positioning the Hall sensor elements 330 inside of the U-shaped magnetic core 325 as shown in FIG. 3 minimizes external interference. In one embodiment, the current measuring device 300 is capable of rejecting various sources of interference so that the minimum amount of current required to make the current measurement is about 0.3 A.

As mentioned and discussed in greater detail below, the region between the Hall sensor elements 330 and defined by the interior surface of the U-shaped magnetic core 325 comprises a current sensing zone within which an electric current flowing through a conductor passing through the current sensing zone can be detected. When such an electric current is flowing, the Hall sensor elements 330 detect a magnetic flux generated by the electric current (alternating current and/or direct current) producing a Hall voltage proportional to the current flow.

As illustrated, a flexible printed circuit board 335 may be used for electrically coupling the Hall sensor elements 330 and the U-shaped magnetic core 325 with an amplifier circuit board 340. The amplifier circuit board 340 may in turn be electrically coupled to an output board 345 for receiving an amplified output signal from the amplifier circuitry associated with the amplifier circuit board 340 and for providing power to the amplifier circuitry.

Moving on, FIG. 4 illustrates a perspective view of a hook-shaped end 420 of a current measuring device according to one embodiment of the invention. As shown, a conductor under test 400 is positioned within a current sensing zone 405. The current sensing zone 405 is illustrated as a hashed area immediately surrounding the conductor under test 400 and is positioned within the upside down U-shaped magnetic core which forms the hook-shaped end 420. Visual target aids 425 may be applied to the exterior surface of the hook-shaped end 420 to assist the user obtain reliable, accurate, and consistent measurements of the current flow 410 through the conductor under test 400. As depicted in FIG. 4, three visual target aids 425 are used. Each comprises a short line directed toward the center of the current sensing zone 405. One is positioned along the lengthwise axis of the hook-shaped end 420 and directed toward the probe body tip 430 opposite the ledge 440. The other two are oriented perpendicular to the same lengthwise axis and positioned on opposite sides of the current sensing zone 405 across each of the sides of the upside down U-shaped magnetic core.

For illustrative purposes, the current flow 410 running through the conductor under test 400 is shown in FIG. 4 flowing to the left. Using the well known right-hand-rule, the magnetic flux 415 generated by the current flow 410 is therefore oriented in a counter-clockwise direction about direction of current flow 410 and is detected by Hall elements disposed as in FIG. 3.

Figure 5A:
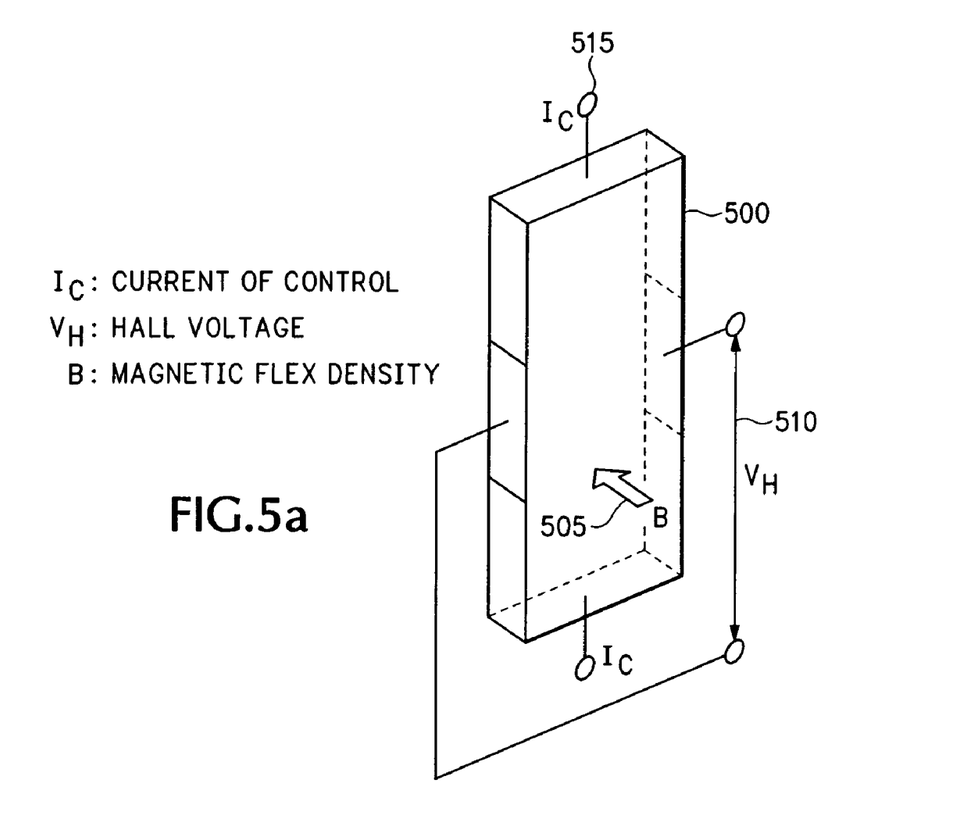
FIGS. 5a and 5b illustrate an exemplary Hall element for use in detecting a magnetic flux generated by an electric current passing through a conductor under test.
Figure 5B:
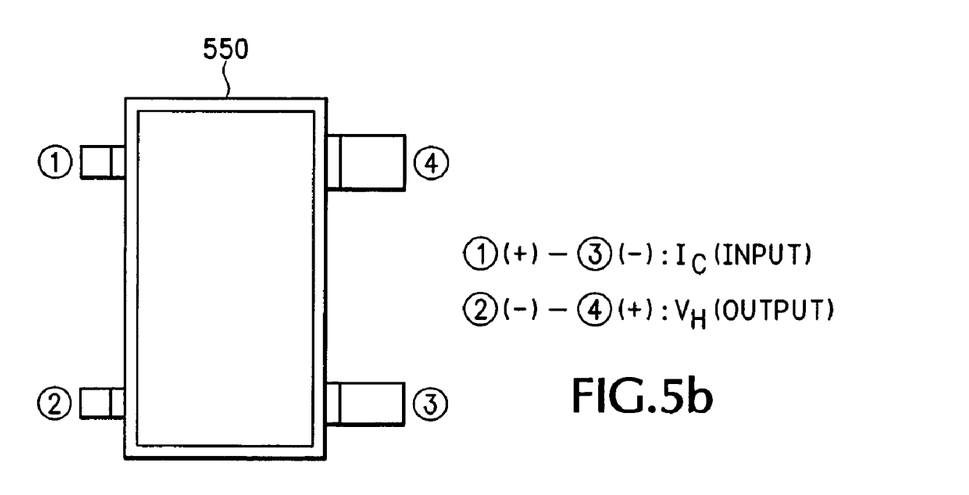

An exemplary Hall element for use in detecting a magnetic flux generated by an electric current passing through a conductor under test is depicted in FIGS. 5a and 5b. In general, a Hall-effect sensor may be composed of a semiconductor plate that can be displaced in a nonuniform magnetic field formed by two poles of a permanent magnet. A constant electric current flows through the plate and the voltage developed across the plate in the direction perpendicular to the current's direction (Hall voltage) is proportional to the flux density or, for the nonuniform field, to the plate's displacement. FIG. 5a illustrates a Hall element 500 with a magnetic flux density B 505 directed transverse to its surface, a Hall voltage $V_H$ 510, and a current of control $I_C$ 515. In operation, the Hall voltage $V_H$ 510 is proportional (within a range of linearity unique to the Hall element 500) to the magnetic flux density B 505 generated by current flowing through a conductor under test, in the presence of a control current $I_C$ 515 provided to the Hall element 500 (perpendicular to the Hall voltage $V_H$ 510), and whereby the magnetic flux density B 505 is proportional to the magnitude of current flowing through the conductor.

In general, the magnetic flux density B 505 is seized or concentrated by the U-shaped magnetic core material as oriented and described in FIG. 3, whereafter Hall elements disposed upon the ends of the interior surface of the U-shaped magnetic core, also as oriented and described in FIG. 3, output a Hall voltage $V_H$ 510 proportional to the magnetic flux density B 505 received by the Hall elements. Each of the Hall elements may comprise a Hall device 550 of the type specified HW108A manufactured by Asahi Kasei Corporation in Japan. However, other Hall elements may be used.

FIG. 5b depicts the external shape and pin configuration for the exemplary HW108A Hall device 550. The element is an Indium Antimonide (InSb) based device, chosen for its improved linearity in the lower amperes range, as opposed to Gallium Arsenide (GaAs) type devices used for clamp-on type current measuring devices.

Figure 6:
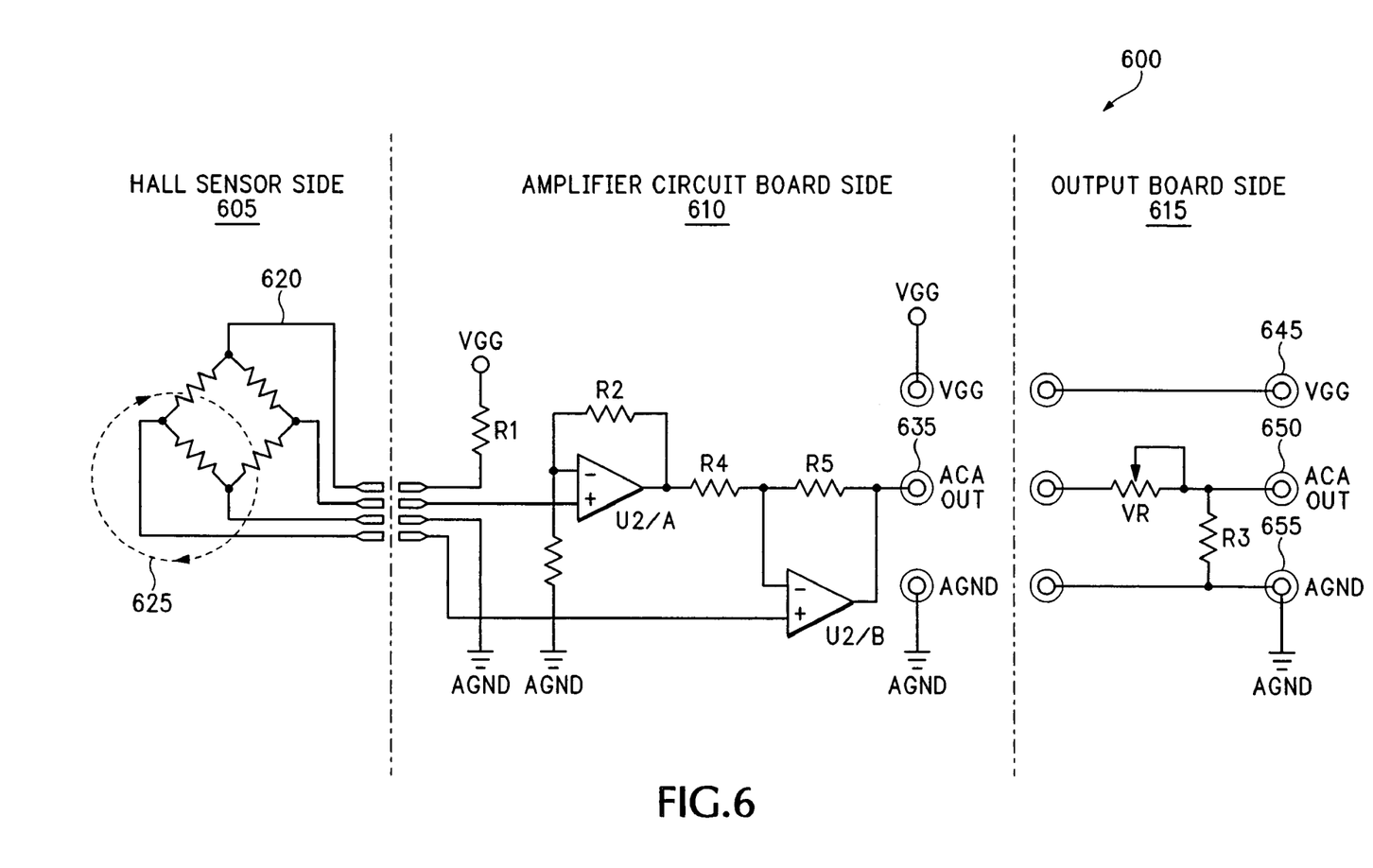
FIG. 6 illustrates exemplary circuitry for a current measuring device according to one embodiment of the invention.

Next, FIG. 6 illustrates exemplary circuitry for a current measuring device 600 according to one embodiment of the invention. As shown, the circuitry 600 includes Hall sensor side circuitry 605, amplifier circuit board side circuitry 610, and output board side circuitry 615. The Hall sensor side circuitry 605 receives a current source 620 and outputs a voltage proportional to a detected magnetic flux density 625. The amplifier circuit board side circuitry 610 delivers an amplified output voltage signal 635. The output board side circuitry 615 receives a power supply voltage 645 and provides an amplified and protected output voltage signal 650 along with ground 655. The exemplary circuitry shown includes commonly used op-amp circuitry and output circuit protection techniques.

Figure 7:
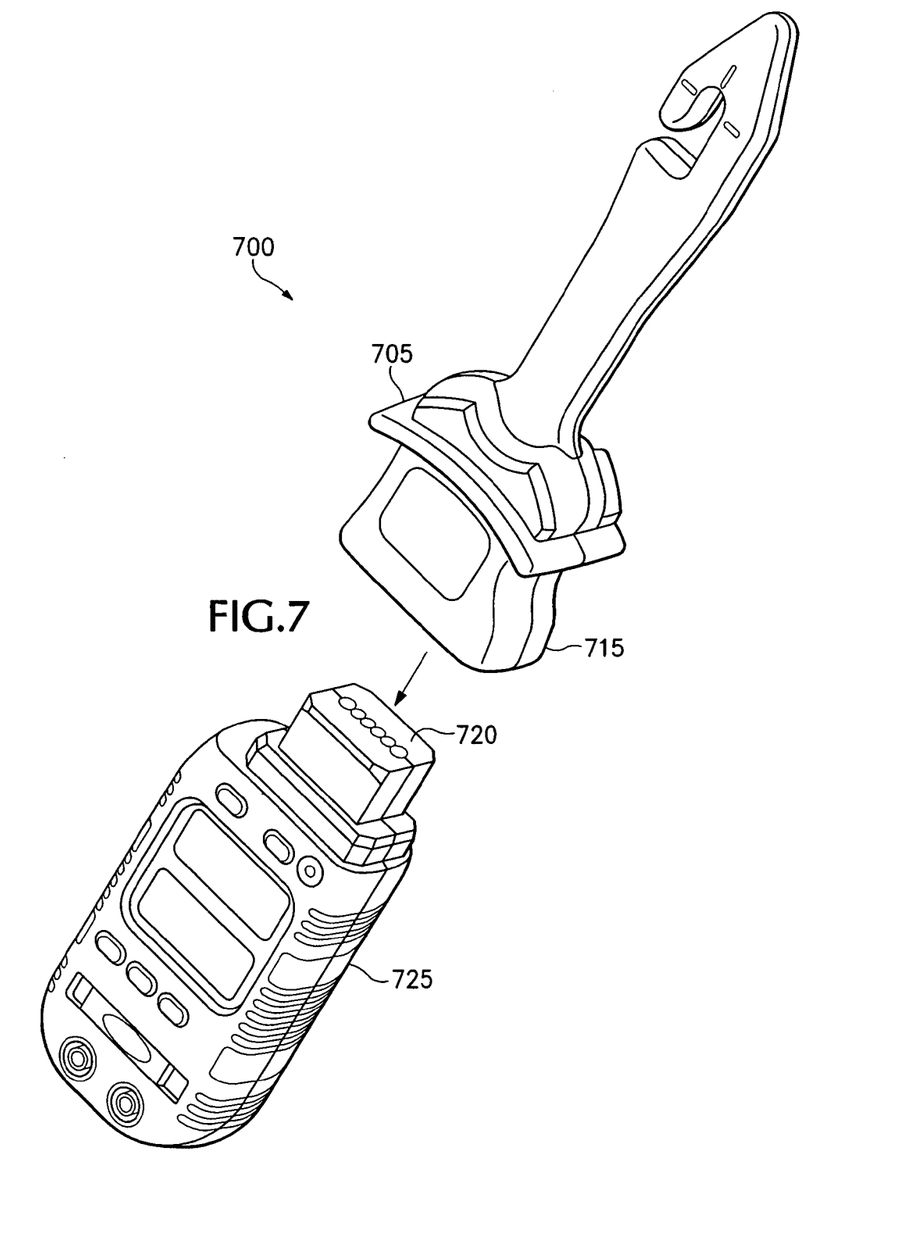
FIG. 7 illustrates perspective views of a hook-shaped probe body and a main body of a current measuring device according to one embodiment of the invention.

Finally, FIG. 7 illustrates perspective views of a hook-shaped probe body 705 and a main body 725 of a current measuring device 700 according to one embodiment of the invention. Pins (not shown) within the rearward end 715 of the hook-shaped probe body 705 may electrically couple with the main body 725 (preferably) using sockets 720. However, other electrical connecting methods or components may be used. For instance, the rearward end 715 of the hook-shaped probe body 705 may incorporate sockets 720 rather than pins, and the main body 725 may, likewise, incorporate pins rather than sockets 720. Further, in one embodiment, where the current measuring device 700 comprises an integrated unit whereby the hook-shaped probe body 705 and the main body 725 form a single integrated device, hardwire connections may be used in place of pins and sockets 720.

As described herein, the present invention provides a current measuring device including a probe body having an elongated portion extending outward to a hook-shaped end wherein the hook-shaped end useful for isolating a conductor under test, a U-shaped magnetic core positioned upside down within the probe body and forming the hook-shaped end of the probe body wherein the U-shaped magnetic core has an interior surface extending between a first end and a second end and defines a current sensing zone therebetween, a first Hall sensor disposed upon the first end of the interior surface of the U-shaped magnetic core, and a second Hall sensor disposed upon the second end of the interior surface of the U-shaped magnetic core wherein the Hall sensors are capable of detecting a magnetic flux generated by an electric current passing through the conductor under test positioned within the current sensing zone. The device may further include amplifier circuitry electrically interconnected with the Hall sensors for amplifying electrical signals therefrom, an output board interconnected with the amplifier circuitry for receiving an amplified output signal from the amplifier circuitry and for providing power to the amplifier circuitry, and a digital multimeter extending rearward from the probe body opposite the hook-shaped end and electrically coupled to the output board.

The terms and expressions which have been employed in the forgoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. A current measuring device comprising:
   (a) a probe body having an elongated portion extending outward to a hook-shaped end, said hook-shaped end useful for isolating a conductor under test;
   (b) a U-shaped magnetic core positioned upside down within said probe body and forming said hook-shaped end of said probe body, said U-shaped magnetic core having an interior surface extending between a first end and a second end and defining a current sensing zone therebetween;
   (c) a first Hall sensor disposed upon said first end of said interior surface of said U-shaped magnetic core; and
   (d) a second Hall sensor disposed upon said second end of said interior surface of said U-shaped magnetic core,
   wherein said Hall sensors are capable of detecting a magnetic flux generated by an electric current passing through said conductor under test positioned within said current sensing zone.

2. The current measuring device of claim 1, further comprising amplifier circuitry electrically interconnected with said Hall sensors for amplifying electrical signals therefrom.

3. The current measuring device of claim 2, further comprising a flexible printed circuit board electrically coupling said Hall sensors with said amplifier circuitry.

4. The current measuring device of claim 2, further comprising an output board interconnected with said amplifier circuitry for receiving an amplified output signal from said amplifier circuitry and for providing power to said amplifier circuitry.

5. The current measuring device of claim 4, further comprising a digital multimeter extending rearward from said probe body opposite said hook-shaped end and electrically coupled to said output board, said digital multimeter having electrical circuitry for at least one of providing power to said amplifier circuitry, receiving said amplified output signal from said amplifier circuitry, receiving said amplified output signal from said amplifier circuitry and converting said amplified output signal from an analog signal to a digital signal, and displaying a current measurement on a display associated with said digital multimeter.

6. The current measuring device of claim 1, wherein each of said Hall sensors comprises a Hall element that outputs a voltage substantially proportional to said magnetic flux generated by said electric current passing through said conductor under test.

7. The current measuring device of claim 1, wherein said magnetic core comprises a non-grain oriented silicon steel material.

8. The current measuring device of claim 1, wherein said current measurement device is capable of measuring said electric current passing through said conductor under test when said electrical current is at least 0.3 amperes.

9. The current measuring device of claim 1, wherein said current measurement device is capable of selectively measuring alternating current and direct current passing through said conductor under test.

10. The current measuring device of claim 1, wherein said hook-shaped end is tapered to ease manipulation of said hook-shaped end within tight spaces for isolating said conductor under test.

11. The current measuring device of claim 1, wherein said hook-shaped end comprises a crochet hook shaped end.

12. The current measuring device of claim 11, wherein said crochet hook shaped end includes a ledge substantially perpendicular to said elongated portion and positioned inward from said current sensing zone and adjacent to the open side of said crochet hook shaped end, whereby said ledge is useful for pushing said conductor under test in an outward direction substantially parallel to said elongated portion of said measurement device and toward said crochet hook shaped end of said measuring device.

13. A handheld current measurement device comprising:
   (a) a probe body having an elongated portion extending outward to a hook-shaped end, said hook-shaped end useful for isolating a conductor under test;
   (b) a U-shaped magnetic core positioned upside down within said probe body and forming said hook-shaped end of said probe body, said U-shaped magnetic core having an interior surface extending between a first end and a second end and defining a current sensing zone therebetween;
   (c) a first Hall sensor disposed upon said first end of said interior surface of said U-shaped magnetic core; and
   (d) a second Hall sensor disposed upon said second end of said interior surface of said U-shaped magnetic core, said Hall sensors capable of detecting a magnetic flux generated by an electric current passing through said conductor under test positioned within said current sensing zone;
   (e) amplifier circuitry electrically interconnected with said Hall sensors for amplifying electrical signals therefrom;
   (f) a main body extending rearward from said probe body opposite said hook-shaped end;
   (f) a display disposed within said main body;

(g) display circuitry electrically coupling said display with said amplifier circuitry and conditioning said electrical signals for said display; and (f) power supply circuitry electrically interconnected with said display circuitry, said display, and said amplifier circuitry for providing power to said handheld current measuring device.

14. The handheld current measuring device of claim 13, wherein each of said Hall sensors comprises a Hall element that outputs a voltage substantially proportional to said magnetic flux generated by said electric current passing through said conductor under test.

15. The handheld current measuring device of claim 13, wherein said magnetic core comprises a non-grain oriented silicon steel material.

16. The handheld current measuring device of claim 13, wherein said handheld current measuring device is capable of measuring said electric current passing through said conductor under test when said electrical current is at least 0.3 amperes.

17. The handheld current measuring device of claim 13, wherein said handheld current measuring device is capable of selectively measuring alternating current and direct current passing through said conductor under test.

18. The handheld current measuring device of claim 13, wherein said hook-shaped end is tapered to ease manipulation of said hook-shaped end within tight spaces for isolating said conductor under test.

19. The handheld current measuring device of claim 13, wherein said hook-shaped end comprises a crochet hook shaped end.

20. The handheld current measuring device of claim 19, wherein said crochet hook shaped end includes a ledge substantially perpendicular to said elongated portion and positioned inward from said current sensing zone and adjacent to the open side of said crochet hook shaped end, whereby said ledge is useful for pushing said conductor under test in an outward direction substantially parallel to said elongated portion of said measurement device and toward said crochet hook shaped end of said handheld current measuring device.

21. A method of measuring current using a hook-shaped current measuring device, the hook-shaped current measuring device comprising a probe body having an elongated portion extending outward to a hook-shaped end useful for isolating a conductor under test, a U-shaped magnetic core positioned upside down within said probe body forming said hook-shaped end of said probe body and having an interior surface extending between a first end and a second end and defining a current sensing zone therebetween, a first Hall sensor disposed upon said first end of said interior surface of said U-shaped magnetic core, and a second Hall sensor disposed upon said second end of said interior surface of said U-shaped magnetic core, the method comprising:

(a) manipulating said hook-shaped end of said probe body to isolate said conductor under test within said current sensing zone of said hook-shaped end;

(b) holding said conductor under test within said current sensing zone; and (c) detecting with said Hall sensors a magnetic flux generated by an electric current passing through said conductor under test positioned within said sensing zone, wherein each of said Hall sensors comprises a Hall element that outputs a voltage substantially proportional to said magnetic flux generated by said electric current passing through said conductor under test.

* * * * *